United States Patent [19]
Schneegans et al.

[11] Patent Number: 5,901,901
[45] Date of Patent: May 11, 1999

[54] SEMICONDUCTOR ASSEMBLY WITH SOLDER MATERIAL LAYER AND METHOD FOR SOLDERING THE SEMICONDUCTOR ASSEMLY

[75] Inventors: Manfred Schneegans, Vaterstetten; Holger Huebner, Baldham, both of Germany

[73] Assignee: Siemens Aktiengesellschaft, Munich, Germany

[21] Appl. No.: 08/802,134

[22] Filed: Feb. 19, 1997

[30] Foreign Application Priority Data

Feb. 19, 1996 [DE] Germany ............................ 196 06 101

[51] Int. Cl.$^6$ .............................. H05K 3/34; H01L 29/00
[52] U.S. Cl. ......................... 228/254; 257/508; 428/642; 428/643; 428/656; 428/661
[58] Field of Search ........................... 257/508; 428/642, 428/643, 656, 661; 228/254

[56] References Cited

U.S. PATENT DOCUMENTS

| | | | |
|---|---|---|---|
| 2,474,039 | 6/1949 | Davignon | 228/254 |
| 4,451,972 | 6/1984 | Batinovich | 29/583 |
| 4,834,794 | 5/1989 | Yagi et al. | 75/255 |
| 5,027,189 | 6/1991 | Shannon et al. | 357/71 |
| 5,108,027 | 4/1992 | Warner et al. | 228/254 |
| 5,405,809 | 4/1995 | Nakamura et al. | 437/209 |
| 5,803,343 | 9/1998 | Sarma et al. | 228/254 |
| 5,816,478 | 10/1998 | Kaskoun et al. | 228/254 |

FOREIGN PATENT DOCUMENTS

| | | |
|---|---|---|
| 38 07 424 A1 | 10/1988 | Germany . |
| 37 40 773 A1 | 6/1989 | Germany . |
| 42 41 439 A1 | 6/1994 | Germany . |
| 1149606 | 4/1969 | United Kingdom . |

Primary Examiner—William Krynski
Assistant Examiner—Cathy Lam
Attorney, Agent, or Firm—Herbert L. Lerner; Laurence A. Greenberg

[57] ABSTRACT

In a semiconductor assembly with a solder material layer and a method for soldering the semiconductor assembly, a silicon semiconductor body with a diffusion barrier layer is provided with a solder material layer, preferably a tin layer. The semiconductor body is then applied to a metal carrier plate and is directly soldered to the carrier plate by heating to temperatures to above 250° C., i.e. without further additions.

3 Claims, 1 Drawing Sheet

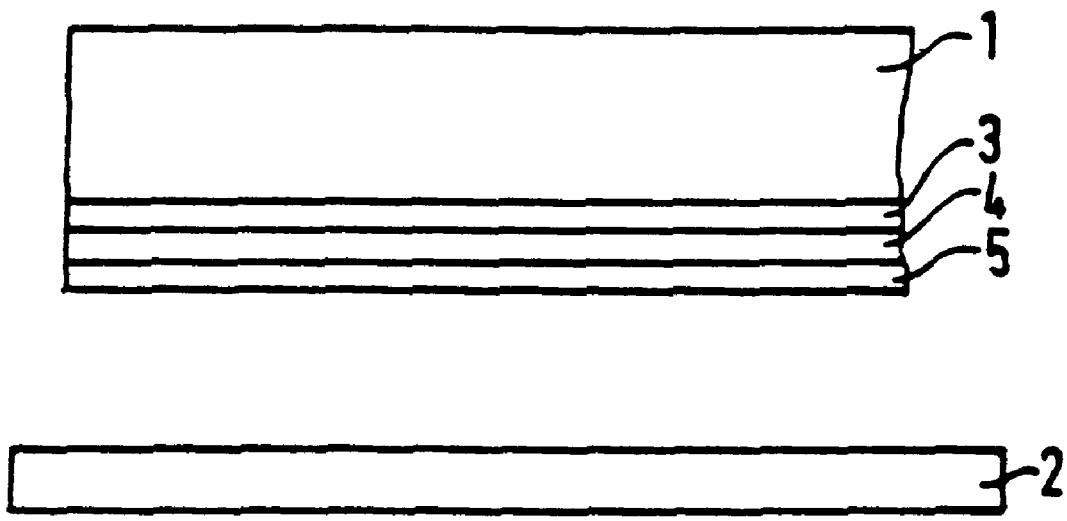

SEMICONDUCTOR ASSEMBLY WITH SOLDER MATERIAL LAYER AND METHOD FOR SOLDERING THE SEMICONDUCTOR ASSEMLY

BACKGROUND OF THE INVENTION

Field of the Invention

The invention relates to a semiconductor assembly with a solder material layer and a method for soldering the semiconductor assembly, in which a semiconductor body formed of silicon is soldered to a metal carrier plate through a sequence of metal layers which, as seen from the silicon toward the carrier plate, includes an aluminum layer and a diffusion barrier layer before soldering.

Such semiconductor bodies are installed in semiconductor components, especially in power semiconductor components, which are on the market in large amounts. The sequence of metal layers as a rule includes an aluminum layer which is disposed on a silicon semiconductor body. The aluminum layer adheres well to silicon and forms a perfect ohmic contact, especially with p-doped silicon. According to the prior art, disposed on the aluminum layer is a diffusion barrier layer formed mostly of titanium or chromium which acts as an adhesion promoter and rearside barrier between a nickel layer disposed on the diffusion barrier layer and the aluminum layer. In the prior art, a noble metal layer is applied to the nickel layer directly or on a thin titanium layer that follows and serves for adhesion improvement. The noble metal layer is mostly formed of silver, gold or palladium and serves as an oxidation protection for the nickel layer.

In the actual soldering process a solder disk is conventionally placed between the thus metallized rearside of the semiconductor body and the metal carrier plate which usually is formed of tin or flux. In the soldering process, the solder layer placed between the carrier plate and the silver layer of the semiconductor body then melts, whereby the silver layer is then dissolved and the nickel layer that follows begins to be dissolve from the solder material and the solder connection is produced.

However, that generally known soldering process has great disadvantages. On one hand, the different coefficients of thermal expansion of nickel and the silicon semiconductor body cause mechanical tension which lead to high wafer bending (bending >1000 $\mu$m) especially in the case of thin semiconductor bodies (thickness $\leq$250 $\mu$m).

This leads to difficult handling of the wafer which leads to increased errors in cassette positioning and which leads to increased danger of breakage during treatment of the wafer. That problem was heretofore solved by trying to minimize the thickness of the nickel layer to such a degree that the soldering still exhibited a sufficient adhesive strength. Regardless of reduced thickness of the nickel layer ($\approx$1 $\mu$m), disc deformations of between 700 and 2000 $\mu$m still occur during production, which lead to the above-mentioned problems.

SUMMARY OF THE INVENTION

It is accordingly an object of the invention to provide a semiconductor assembly with a solder material layer and a method for soldering the semiconductor assembly, which overcome the hereinafore-mentioned disadvantages of the heretofore-known devices and methods of this general type and which make it possible to metallize a silicon semiconductor body in such a way that disc deformation can be reduced sharply without suffering a loss of adhesion stability on carrier materials.

With the foregoing and other objects in view there is provided, in accordance with the invention, a semiconductor assembly, comprising a silicon semiconductor body; a metal carrier plate; and a sequence of metal layers for soldering the semiconductor body to the carrier plate, the sequence of metal layers before soldering including an aluminum layer disposed toward the semiconductor body, a diffusion barrier layer, and a solder material layer applied on the diffusion barrier layer and disposed toward the carrier plate.

In accordance with another feature of the invention, the solder material layer is a tin layer or a lead layer or a gallium layer.

In accordance with a further feature of the invention, the diffusion barrier layer has a thickness of approximately 50 nm.

In accordance with an added feature of the invention, the solder material layer has a thickness of less than 3000 nm.

With the objects of the invention in view there is also provided a method for soldering a semiconductor body onto a metal carrier plate, which comprises soldering the semiconductor body on the metal carrier plate in such a way that the semiconductor body is applied to the carrier plate and directly soldered to the carrier plate by heating to temperatures above approximately 250° C., i.e. without the addition of further soldering materials and soldering flux.

This creates an almost tension-free solder layer which leads to substrate bendings of less than 300 $\mu$m. Furthermore, the adhesion stability of the soldered semiconductor body on the carrier plate is very high, i.e. in ranges of more than 30 Mpa. Additionally, no further embrittlement or decay due to temperature-alternating stress occurs, since the metallic phases are only thinly defined. As a whole, the problems in handling the wafer and the danger of breakage are therefore eliminated.

Furthermore, a distinct cost reduction can be realized with the metallized semiconductor bodies according to the invention and the method according to the invention, since the costs of materials can be decreased due to the omission of an oxidation protection layer and the production rate can be increased. Additionally, the method according to the invention is especially friendly to the environment because cleaning steps with CFC-solvents are eliminated due to the freedom from soldering flux.

Other features which are considered as characteristic for the invention are set forth in the appended claims.

Although the invention is illustrated and described herein as embodied in a semiconductor assembly with a solder material layer and a method for soldering the semiconductor assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

The FIGURE of the drawing is a fragmentary, diagrammatic, sectional view of a semiconductor assembly according to the invention.

BRIEF DESCRIPTION OF THE DRAWING

Referring now in detail to the single FIGURE of the drawing, there is seen a layer sequence of metals before soldering. According to the invention, an aluminum layer 3 which is applied on a semiconductor body 1 adheres well on the silicon and forms a perfect ohmic contact with p-doped silicon. A diffusion barrier layer 4 which is disposed on the aluminum layer 3 is formed of chromium or titanium with a thickness of approximately 50 nm. This layer is either directly sputtered on the aluminum layer 3 or directly vacuum metallized. A non-illustrated adhesion-promoting layer, for example Cu, is applied on the diffusion barrier layer 4 or a solder material layer 5 is directly applied. The solder layer 5 is either formed of tin, gallium or lead and has a thickness of 1000 to 3000 nm. When using tin, the thickness usually amounts to 2700 nm. The thus metallized silicon semiconductor body 1 is then pressed on a metal carrier plate 2 which usually is formed of copper and is connected to the same in a protective gas atmosphere or in a vacuum at approximately 300° C. In this way a metallurgical connection between the diffusion barrier layer 4, the solder material layer 5 and the carrier plate 2 is created, which is stable up to a temperature of approximately 450° C.

A product of high quality is created through the use of the method according to the invention since the described sequence of layers produces an especially good mechanically and electrically stable contact. The method can be described as being very advantageous as compared to the prior art in technological as well as economical and ecological respects.

Technologically, the method according to the invention opens the possibility of further reducing the thicknesses of the silicon semiconductor substrate which leads to an improvement in the porous quality of the power semiconductor components. Economically, the advantage lies in the fact that costs of the material can be decreased and that the production rate can be increased. Finally, the ecological advantage of the method according to the invention lies in the fact that the solder process is carried out without solder flux and that cleaning steps with CFC-containing solvents can be avoided.

We claim:

1. A semiconductor assembly, comprising:

a silicon semiconductor body;

a metal carrier plate; and a sequence of metal layers for soldering said semiconductor body to said carrier plate, said sequence of metal layers before soldering consisting essentially of an aluminum layer disposed toward said semiconductor body, a diffusion barrier layer selected from the group consisting of chromium and titanium, and a solder material layer applied on said diffusion barrier layer and disposed toward said carrier plate, said solder material layer having a thickness of less than 3000 nm.

2. The semiconductor assembly according to claim 1, wherein said solder material layer is formed of a material selected from the group consisting of tin, lead and gallium.

3. The semiconductor assembly according to claim 1, wherein said diffusion barrier layer has a thickness of approximately 50 nm.

* * * * *